United States Patent
Chung

(10) Patent No.: US 7,164,295 B2
(45) Date of Patent: Jan. 16, 2007

(54) FEEDBACK CONTROL SYSTEM AND METHOD

(75) Inventor: In-young Chung, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 28 days.

(21) Appl. No.: 10/848,034

(22) Filed: May 18, 2004

(65) Prior Publication Data

US 2004/0246041 A1    Dec. 9, 2004

(30) Foreign Application Priority Data

Jun. 3, 2003    (KR) .................. 10-2003-0035563

(51) Int. Cl.
*H03K 5/153* (2006.01)
(52) U.S. Cl. .................. 327/87; 327/155; 327/160
(58) Field of Classification Search .............. 327/3, 327/5, 7, 16–17, 40–41, 48, 63, 67, 71–75, 327/82, 90, 146, 151, 155, 160; 375/376
See application file for complete search history.

(56) References Cited

U.S. PATENT DOCUMENTS 5,001,726 A * 3/1991 Kawai et al. .............. 375/317
6,694,105 B1 * 2/2004 Chang et al. .............. 398/202
6,701,445 B1 * 3/2004 Majos ....................... 713/500

FOREIGN PATENT DOCUMENTS

KR    1995-0006559    3/1995
KR    2001-0024327    6/2001

* cited by examiner

Primary Examiner—My-Trang Nu Ton
(74) Attorney, Agent, or Firm—Mills & Onello LLP

(57) ABSTRACT

A feedback control system and method thereof are provided. The feedback control method includes (a) comparing the level of a reference signal with the levels of first and second signals, (b) if the levels of the first and second signals are lower than the level of the reference signal, generating a first control signal, if the levels of the first and second signals are higher than the level of the reference signal, generating a second control signal, and if the level of the reference signal is between the level of the first signal and the level of the second signal, generating a third control signal, (c) controlling the level of an output signal in response to the first through third control signals, and (d) outputting the controlled output signal and generating the first signal and the second signal.

16 Claims, 6 Drawing Sheets

FEEDBACK CONTROL SYSTEM AND METHOD

BACKGROUND OF THE INVENTION

This application claims the priority of Korean Patent Application No. 2003-35563, filed on Jun. 3, 2003, in the Korean Intellectual Property Office, the contents of which are incorporated herein in their entirety by reference.

1. Field of the Invention

The present invention relates to a semiconductor integrated circuit (IC), and more particularly, to a method of removing noise occurring when an analog signal of a semiconductor integrated circuit (IC) is controlled using feedback, and a system therefor.

2. Description of the Related Art

An analog circuit for a semiconductor integrated circuit (IC) feeds back its own output and compares the fed-back output with a level of a reference signal, so as to obtain a desired output level. The analog circuit includes a phase locked loop (PLL) or a delay locked loop (DLL) and an impedance control circuit or an output current control circuit for an output driver.

In order to control the output of the analog circuit, a detector which compares the output of the analog circuit with a reference value, a controller which receives the output of the detector and controls an output value of the analog circuit, and a state-machine which stores and indicates a current state, should be provided.

Feedback control methods include an analog feedback control method and a digital feedback control method. In the analog feedback control method, the output of the detector is an analog level proportional to a difference between a reference value and an output level of the analog circuit, where the state of the state-machine indicates a consecutive value. Thus, an output state also indicates a consecutive value.

On the contrary, in the digital feedback control method, the output of the detector has a finite discrete value, such as 1 or 0, and an output value is obtained by varying the value of a finite state machine (FSM) (mostly, counter) which is a state-machine and controlling the analog circuit based on the value. Thus, in the digital feedback control method, the output value is not consecutive but is quantized according to the size and resolution of the FSM.

Both the analog feedback control method and the digital feedback control method have advantages and disadvantages. However, since due to control using the FSM, the current state is stored and a variety of processing is possible, the digital feedback control method is widely used.

FIG. 1 is a block diagram of a conventional digital feedback control method performed using an analog circuit.

A detector 110 compares a current output value OUT with a reference value REF and determines the variation direction of an output. According to a determination result, the detector 110 outputs a rising signal or a falling signal UP/DOWN, and a counter 130 controls the value of the counter 130 of a finite state machine (FSM) 120 in response to the rising signal or the falling signal UP/DOWN.

The output of the counter 130 is applied to a digital-to-analog converter (DAC) 140 and converted into an analog control signal CTRL, and an output value OUT of an analog circuit, i.e., an output value OUT of a generator 150 is controlled using the converted analog control signal CTRL.

For example, if the current output value OUT is smaller than the desired reference value REF, the detector 110 increases the value of the counter 130 by generating a rising signal UP. As a result, the level of the analog control signal CTRL is increased. Thus, the output value OUT is increased and reaches the reference value REF. By repeating the above operation, the output value OUT is almost the same as the reference value REF.

Coming and going based on the reference value REF from when the output value OUT is almost the same as the reference value REF, is repeated and is referred to as bang—bang. For example, if the output value OUT is a little smaller than the reference value REF, the detector 110 generates a rising signal UP and increases the output value OUT by 1.

However, if the output value OUT increased by 1 is higher than the reference value REF, during a next comparison operation, the detector 110 generates a falling signal DOWN and controls the output value OUT to return to its original state, and the above operation is continuously repeated. The above operation is referred to as a bang—bang operation and is shown in FIG. 2.

The bang—bang operation causes a noise component for an analog output value. In a delay locked loop (DLL) and also causes jitter noise.

SUMMARY OF THE INVENTION

The present invention provides a feedback control method capable of removing output noise.

The present invention also provides a feedback control system capable of removing output noise.

According to one aspect of the present invention, there is provided a feedback control method, the method comprising (a) comparing the level of a reference signal with the levels of first and second signals, (b) if the levels of the first and second signals are lower than the level of the reference signal, generating a first control signal, if the levels of the first and second signals are higher than the level of the reference signal, generating a second control signal, and if the level of the reference signal is between the level of the first signal and the level of the second signal, generating a third control signal, (c) controlling the level of an output signal in response to the first through third control signals, and (d) outputting the controlled output signal and generating the first signal and the second signal.

In one embodiment, step (c) comprises (c1) increasing a predetermined digital value in response to the first through third control signals and outputting the increased digital value, (c2) converting the output digital value into an output control signal which is an analog value, and (c3) controlling the level of the output signal in response to the output control signal.

In one embodiment, the first control signal is used to increase the level of the output signal, the second control signal is used to reduce the level of the output signal, and the third control signal is used to hold the level of the output signal.

The level of the first signal can be higher than the level of the output signal by a predetermined offset, and the level of the second signal is lower than the level of the output signal by the offset.

One of the first signal and the second signal can have the same level as the level of the output signal, and the other has a level higher or lower than the level of the output signal by a predetermined offset.

According to another aspect of the present invention, there is provided a feedback control system. The system comprises a detector, a controller, and an output signal generator.

The detector compares the level of a reference signal with the levels of first and second signals. If the levels of the first and second signals are lower than the level of the reference signal, the detector generates a first control signal, and if the levels of the first and second signals are higher than the level of the reference signal, the detector generates a second control signal. If the level of the reference signal is between the level of the first signal and the level of the second signal, and generates a third control signal. The controller generates an output control signal used to control the level of an output signal in response to the first through third control signals. The output signal generator outputs the controlled output signal in response to the output control signal and generates the first signal and the second signal.

The controller includes a counter, which counts a digital value in response to the first through third control signals and outputs the digital value, and a digital-to-analog converter, which converts the output of the counter into an output control signal which is an analog value.

In one embodiment, the first control signal is used to ncrease the level of the output signal, the second control signal is used to reduce the level of the output signal, and the third control signal is used to hold the level of the output signal. In one embodiment, the level of the first signal is higher than the level of the output signal by a predetermined offset, and the level of the second signal is lower than the level of the output signal by the offset. In one embodiment, one of the first signal and the second signal has the same level as the level of the output signal, and the other has a level higher or lower than the level of the output signal by a predetermined offset.

According to another aspect of the present invention, there is provided an output driver current control circuit, the circuit comprises a detector, a counter, and an output driver controller.

The detector compares the level of a reference current with the levels of first and second signals, if the levels of the first and second signals are lower than the level of the reference current, generates a first control signal. If the levels of the first and second signals are higher than the level of the reference current, the detector generates a second control signal, and if the level of the reference current is between the level of the first signal and the level of the second signal, the detector generates a third control signal.

The counter outputs a first counter bit and a second counter bit used to control the current level of an output driver in response to the first through third control signals. The output driver controller controls the current level of the output driver in response to the first counter bit and the second counter bit and generates the first signal and the second signal.

In one embodiment, the detector includes a first comparison portion, which compares the level of the first signal with the level of the reference current, a second comparison portion, which compares the level of the second signal with the level of the reference current, and a determination portion, which generates the first through third control signals in response to the outputs of the first comparison portion and the second comparison portion.

In one embodiment, the output driver controller includes a first output driver, which controls the current level of the output driver in response to the first counter bit and outputs the first signal corresponding to the controlled current level, and a second output driver, which controls the current level of the output driver in response to the second counter bit and outputs the second signal corresponding to the controlled current level.

The first control signal can be used to increase the level of the output signal, the second control signal can be used to reduce the level of the output signal, and the third control signal can be used to hold the level of the output signal.

The output driver current control circuit can be mounted on a Rambus DRAM.

BRIEF DESCRIPTION OF THE DRAWINGS

The foregoing and other features and advantages of the invention will be apparent from the more particular description of an embodiment of the invention, as illustrated in the accompanying drawing. The drawing is not necessarily to scale, emphasis instead being placed upon illustrating the principles of the invention.

DETAILED DESCRIPTION OF THE INVENTION

Figure 1:
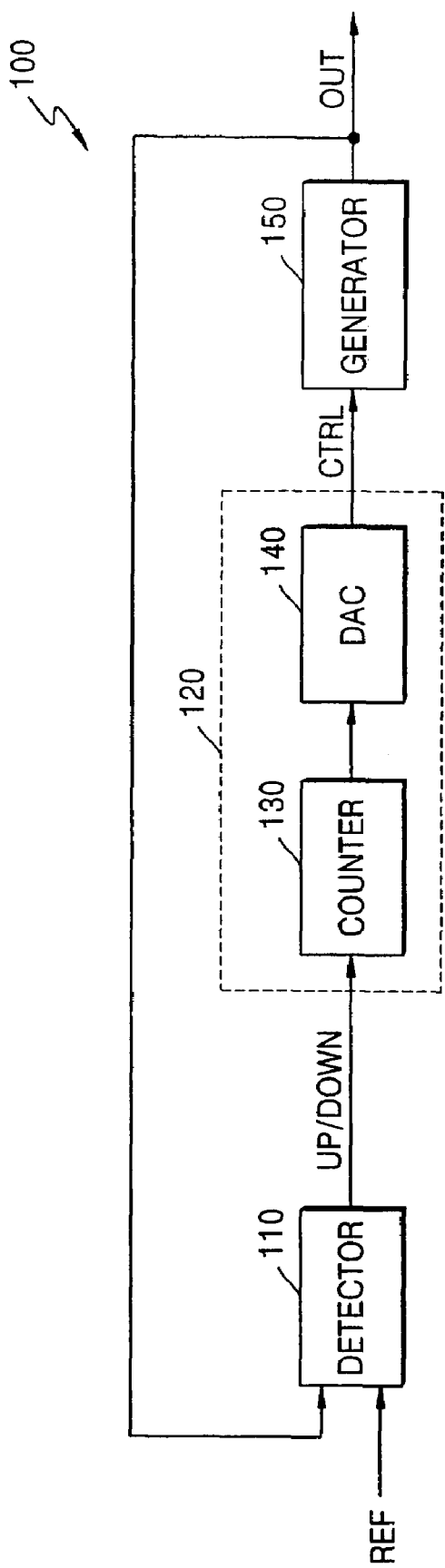
FIG. 1 is a block diagram of a conventional digital feedback control method performed using an analog circuit.
Figure 2:
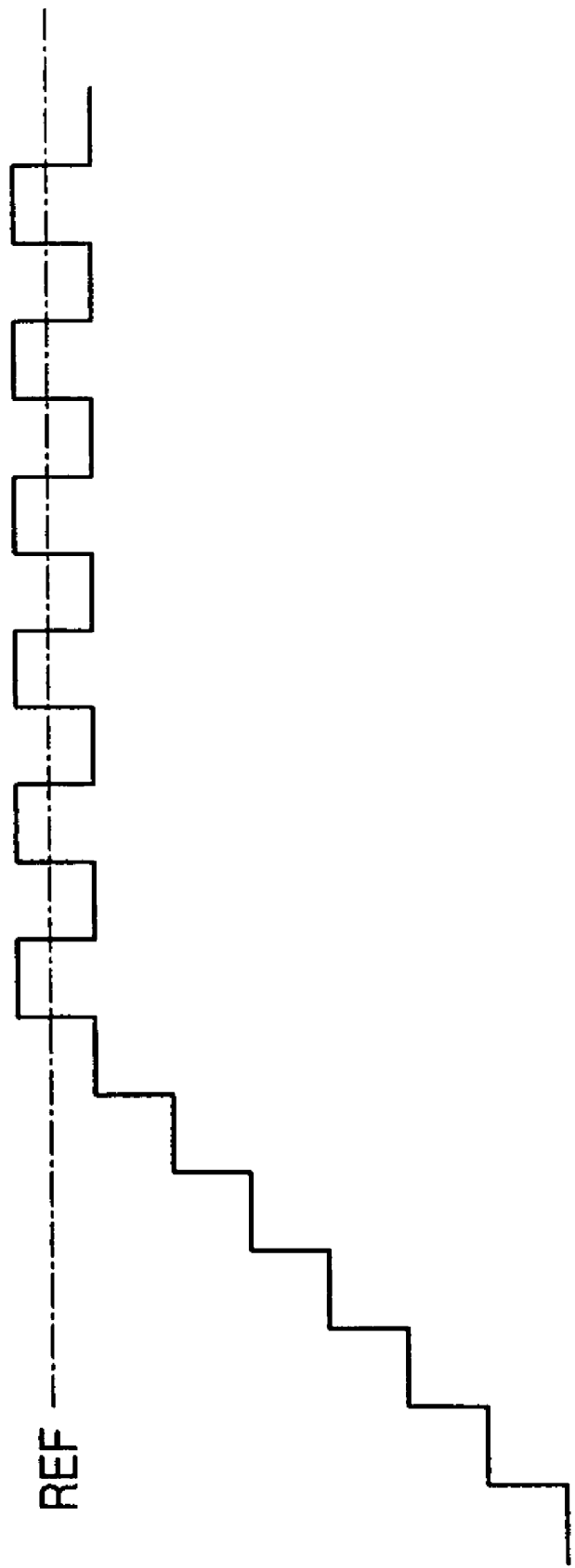
FIG. 2 illustrates a bang—bang operation.
Figure 3:
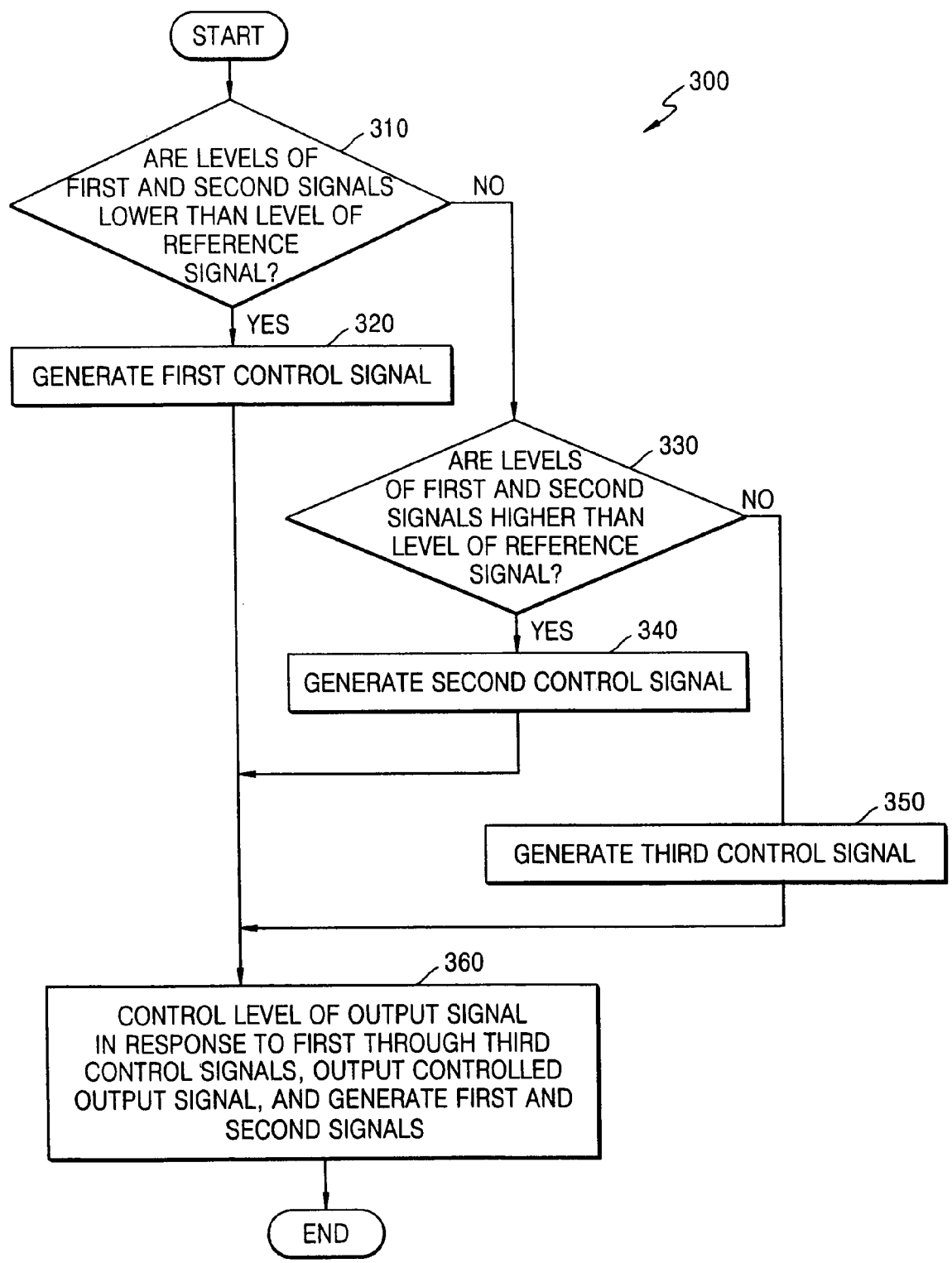
FIG. 3 is a flowchart of a feedback control method according to the present invention.

FIG. 3 is a flowchart of a feedback control method according to the present invention. Referring to FIG. 3, in step 310, the level of a reference signal is compared with levels of first and second signals. If the levels of the first and second signals are lower than the level of the reference signal, a first control signal is generated in step 320. If the levels of the first and second signals are higher than the level of the reference signal, a second control signal is generated as shown in steps 330 and 340. If the level of the reference signal is between the level of the first signal and the level of the second signal, a third control signal is generated in step 350.

In step 360, the level of an output signal is controlled in response to the first through third control signals, the controlled output signal is output, and the first signal and the second signal are generated.

Figure 4:
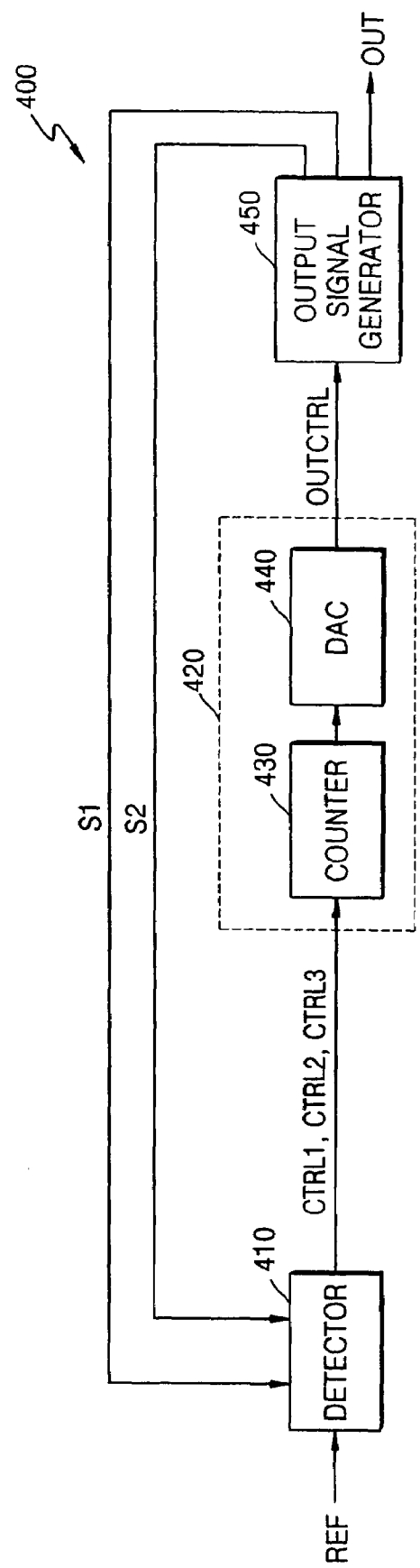
FIG. 4 is a block diagram of a feedback control system according to the present invention.

FIG. 4 is a block diagram of a feedback control system according to the present invention.

Hereinafter, a feedback control system and a method thereof according to the present invention will be described in detail with reference to FIGS. 3 and 4.

In one embodiment, the operation of steps 310 through 350 is performed by a detector 410 of FIG. 4, and the operation of step 360 is performed by a controller 420 and an output signal generator 450 of FIG. 4. First and second signals S1 and S2, instead of an output signal OUT are fed back to be compared with a reference signal REF.

There are minute differences in level between the first signal S1 and the second signal S2, and the values of the first signal S1 and the second signal S2 are very close to the level of the output signal OUT. That is, the level of the first signal S1 may be higher than the level of the output signal OUT by a predetermined offset, and the level of the second signal S2 may be lower than the level of the output signal OUT by the offset.

Alternatively, one of the first signal S1 and the second signal S2 has the same level as the level of the output signal OUT, and the other has a level higher or lower than the level of the output signal OUT by a predetermined offset.

Here, the offset is the level variation amount of the output signal OUT corresponding to 1-bit variations in the counter 430 of FIG. 4. As the level of the output signal OUT is varied, the levels of the first and second signals S1 and S2 are varied.

The detector 410 can output three states through comparison of the first signal S1, the second signal S2, and the reference signal REF.

If both the levels of the first signal S1 and the second signal S2 are lower than the level of the reference signal REF, the detector 410 generates a first control signal CTRL1 used to increase the level of the output signal OUT. If both the levels of the first signal S1 and the second signal S2 are higher than the level of the output signal OUT, the detector 410 generates a second control signal CTRL2 used to reduce the level of the output signal OUT.

In addition, if the level of the first signal S1 is higher than the level of the reference signal REF and the level of the second signal S2 is lower than the level of the reference signal REF, the detector 410 generates a third control signal CTRL3 used to hold the level of the output signal OUT.

If the level of the output signal OUT is clearly different from the level of the reference signal REF, the detector 410 generates the first control signal CTRL1 or the second control signal CTRL2. It would be readily understood to a person skilled in the art how to make the detector 410 in accordance with the foregoing.

The first control signal CTRL1 or the second control signal CTRL2 are used to increase or reduce a digital value of the counter 430. A digital-to-analog converter (DAC) 440 converts the output of the counter 430 into an analog signal and generates as an output control signal OUTCTRL. The output control signal OUTCTRL is applied to the output signal generator 450 and is used to increase or reduce the level of the output signal OUT.

A person skilled in the art would readily understand how to make the output signal generator 450 which controls the level of the output signal OUT in response to the output control signal OUTCTRL and generates the first signal S1 and the second signal S2 having a predetermined offset with the level of the output signal OUT.

Through the above operation, the level of the output signal OUT comes close to the level of the reference signal REF gradually. If the level of the reference signal REF is between the level of the first signal S1 and the level of the second signal S2, and the detector 410 generates a third control signal CTRL3.

The third control signal CTRL3 is used to hold the digital value of the counter 430 in a current state, and then is used to hold the level of the output signal OUT in the current state. Thus, the noise of the output signal OUT that occurs in a bang—bang operation can be removed.

If the level of the reference signal REF is varied, the level of the output signal OUT also follows the reference signal REF.

Figure 5:
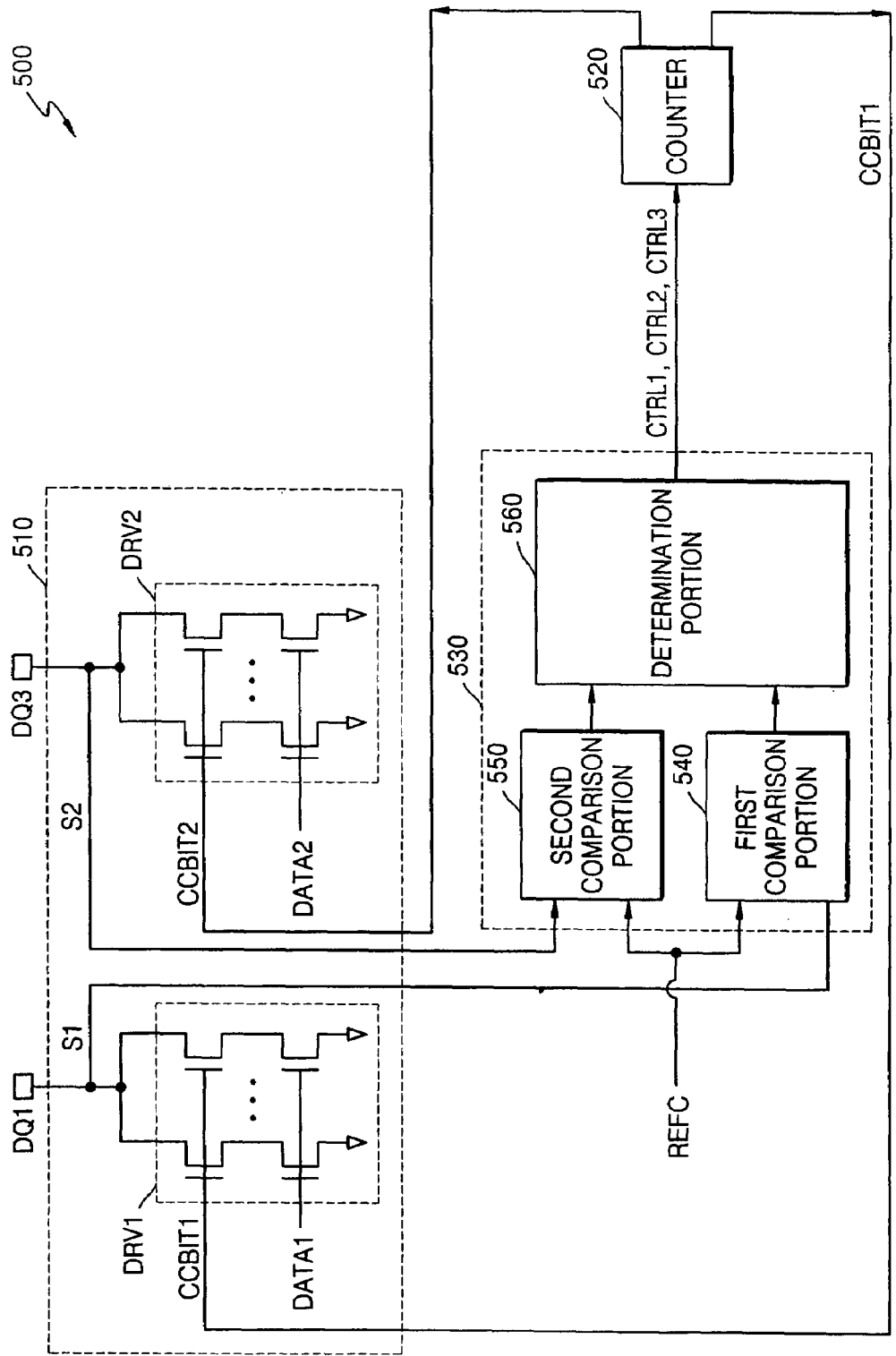
FIG. 5 is a block diagram of an output driver current control circuit according to an embodiment of the present invention.

FIG. 5 is a block diagram of an output driver current control circuit according to an embodiment of the present invention.

Referring to FIG. 5, an output driver current control circuit 500 includes a detector 530, a counter 520, and an output driver controller 510.

The detector 530 compares the level of a reference current REFC with the levels of first and second signals S1 and S2, generates a first control signal if the levels of the first and second signals S1 and S2 are lower than the level of the reference current REFC, generates a second control signal if the levels of the first and second signals S1 and S2 are higher than the level of the reference current REFC, and generates a third control signal CTRL3 if the level of the reference current REFC is between the level of the first signal S1 and the level of the second signal S2.

The counter 520 outputs a first counter bit CCBIT1 and a second counter bit CCBIT2 used to control the current level of an output driver in response to first through third control signals CTRL1, CTRL2, and CTRL3. The output driver controller 510 controls the current level of the output driver in response to the first counter bit CCBIT1 and the second counter bit CCBIT2 and generates the first signal S1 and the second signal S2.

Hereinafter, the operation of the output driver current control circuit according to an embodiment of the present invention will be described in detail with reference to FIG. 5.

An output unit of a typical Rambus DRAM includes a plurality of output drivers, each output driver being connected to each of a plurality of output pads (not shown). Each output driver receives data from a memory array (not shown) and outputs the data to the outside through each output pad.

The output driver includes a plurality of transistor pairs in which an NMOS transistor receiving data and an NMOS transistor receiving a counter bit output from a predetermined counter are connected in series. The counter bit output from the counter is used to turn on or turn off a corresponding NMOS transistor and is used to control the current level of the output driver.

In a typical Rambus DRAM, the current level of the whole output driver is held by about 28.6 mA in a bang—bang control format using only one output driver.

However, the output driver current control circuit 500 of FIG. 5 holds the current level of the output driver using the first and second counter bits CCBIT1 and CCBIT2 having a predetermined offset with two output drivers DRV1 and DRV2 if the current level of the output driver reaches a desired level.

The output driver controller 510 includes a first output driver DRV1 and a second output driver DRV2. The first output driver DRV1 controls the current level of the first output driver DRV1 in response to the first counter bit CCBIT1 and outputs a first signal S1 corresponding to the controlled current level of the first output driver DRV1.

The second output driver DRV2 controls the current level of the second output driver DRV2 in response to the second counter bit CCBIT2 and outputs a second signal S2 corresponding to the controlled current level of the second output driver DRV2.

The first and second output drivers DRV1 and DRV2 determine the current levels of the first and second output drivers DRV1 and DRV2 depending on whether NMOS transistors are turned on in response to the first and second counter bits CCBIT1 and CCBIT2.

The detector 530 compares the level of the reference current REFC with the levels of the first and second signals S1 and S2. The first signal S1 corresponds to the current level of the first output driver DRV1, and the second signal S2 corresponds to the current level of the second output driver DRV2.

The detector 530 includes a first comparison portion 540, a second comparison portion 550, and a determination portion 560. The first comparison portion 540 compares the level of the first signal S1 with the level of the reference current REFC. The second comparison portion 550 compares the level of the second signal S2 with the level of the reference current REFC.

The determination portion 560 generates first through third control signals CTRL1, CTRL2, and CTRL3 in response to outputs of the first comparison portion 540 and the second comparison portion 550.

If the levels of the first and second signals S1 and S2 are lower than the level of the reference current REFC, the determination portion 560 generates the first control signal CTRL1 used to increase the current levels of the first and second output drivers DRV1 and DRV2.

If the levels of the first and second signals S1 and S2 are higher than the level of the reference current REFC, the determination portion 560 generates the second control signal CTRL2 used to increase the current levels of the first and second output drivers DRV1 and DRV2.

If the level of the reference current REFC is between the level of the first signal S1 and the level of the second signal S2, the determination portion 560 generates the third control signal CTRL3 used to hold the current levels of the first and second output drivers DRV1 and DRV2.

The counter 520 outputs a first counter bit CCBIT1 and a second counter bit CCBIT2 used to control the current levels of the first and second output drivers DRV1 and DRV2 in response to the first through third control signals CTRL1, CTRL2, and CTRL3. If the first control signal CTRL1 is received, the counter 520 generates the first counter bit CCBIT1 and the second counter bit CCBIT2 as larger values by performing an up-counting operation.

Then, the current levels of the first and second output drivers DRV1 and DRV2 are increased, and the levels of the first and second signals S1 and S2 come close to the level of the reference current REFC.

If the second control signal CTRL2 is received, the counter 520 generates the first counter bit CCBIT1 and the second counter bit CCBIT2 as smaller values by performing a down-counting operation. Then, the current levels of the first and second output drivers DRV1 and DRV2 are reduced, and the levels of the first and second signals S1 and S2 come close to the level of the reference current REFC.

After the above operation is repeated, and if the level of the reference current REFC is between the level of the first signal S1 and the level of the second signal S2, the determination portion 560 generates the third control signal CTRL3, and the counter 520 holds a current counter value. Then, the first counter bit CCBIT1 and the second counter bit CCBIT2 are held constant such that the current levels of the first and second output drivers DRV1 and DRV2 are held constant.

The current level of the output driver cannot be held in a bang—bang state but can be held constant using the output driver current control circuit 500 of FIG. 5.

Figure 6:
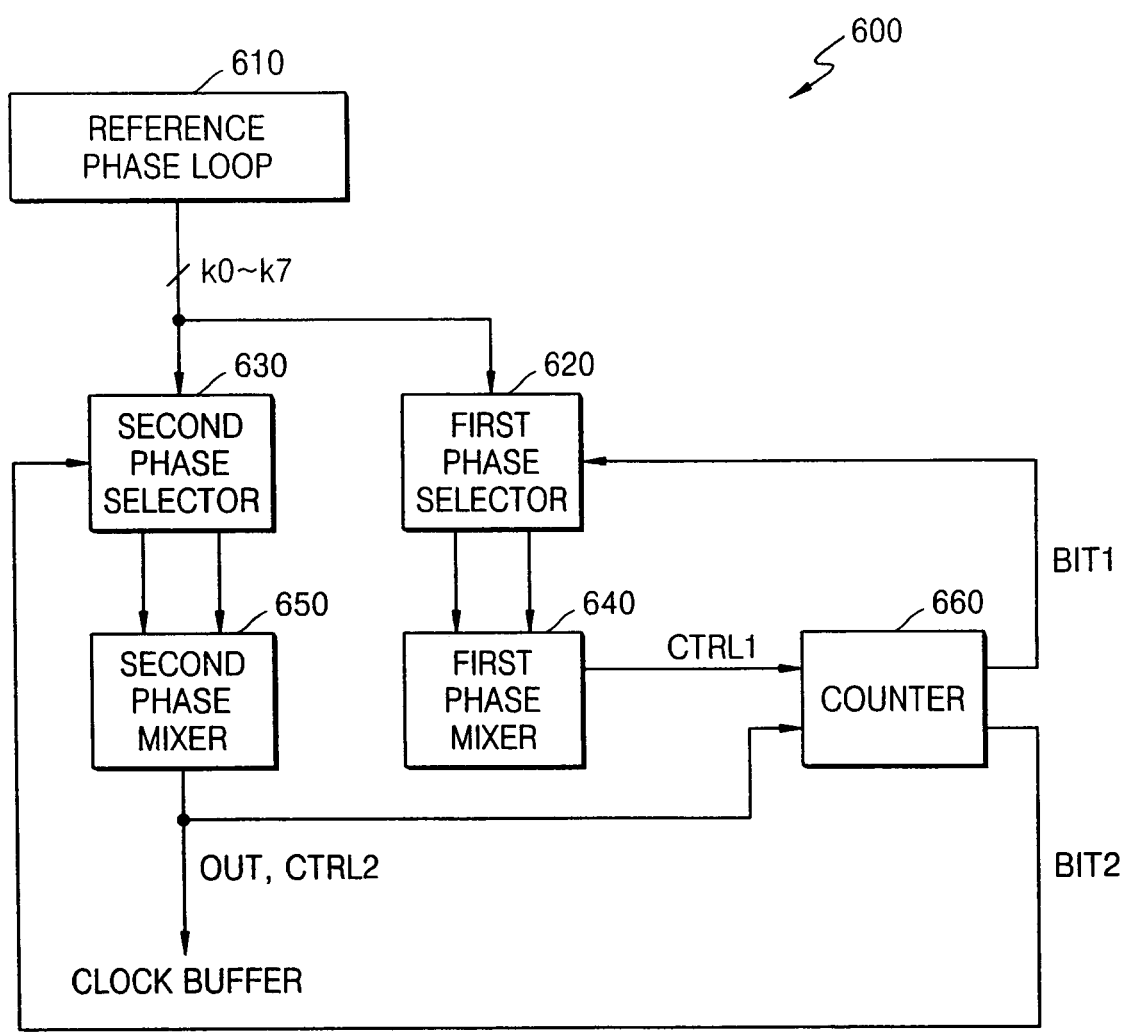
FIG. 6 is a block diagram in which the present invention is applied to a delay locked loop (DLL) of a Rambus DRAM.

FIG. 6 is a block diagram illustrating a configuration in which the present invention is applied to a delay locked loop (DLL) of a Rambus DRAM.

A delay locked loop (DLL) (not shown) of a typical Rambus DRAM generates eight phase vectors in a reference phase loop and selects two phase vectors from the eight phase vectors in response to counter bits. The two selected phase vectors are mixed by a phase mixer, become a signal having a desired phase, and are output to a clock buffer.

An embodiment in which the present invention is applied to the DLL of the Rambus DRAM is shown in FIG. 6.

First and second phase selectors 620 and 630 select two phase vectors from eight phase vectors k0 to k7 output from a reference phase loop 610 in response to first and second counter bits BIT1 and BIT2 and output the two selected phase vectors. First and second phase mixers 640 and 650 mix each received phase vector with one another and output a signal having a desired phase to the clock buffer.

In this case, a counter 660 receives the output of the second phase mixer 650 and the output of the first phase mixer 640 output to the clock buffer and generates the first and second counter bits BIT1 and BIT2. The first counter bit BIT1 is larger or smaller than the second counter bit BIT2 by 1.

The first counter bit BIT1 is applied to the first phase sector 620 and selects a signal having a phase larger or smaller than a phase selected by the second counter bit BIT2 by a predetermined amount.

Then, there may be a phase vector having a desired phase between selected phase vectors by controlling the first and second counter bits BIT1 and BIT2, and a signal having a predetermined phase without bang—bang noise can be output to the clock buffer.

As described above, in the feedback control method and system according to the present invention, output noise occurring when an analog signal of a semiconductor integrated circuit (IC) is controlled using feedback can be removed.

While this invention has been particularly shown and described with reference to a preferred embodiment thereof, it will be understood by those skilled in the art that various changes in form and details may be made therein without departing from the spirit and scope of the invention as defined by the appended claims.

What is claimed is:

1. A feedback control method comprising:
 (a) comparing the level of a reference signal with the levels of first and second signals;
 (b) if the levels of the first and second signals are lower than the level of the reference signal, generating a first control signal, if the levels of the first and second signals are higher than the level of the reference signal, generating a second control signal, and if the level of the reference signal is between the level of the first signal and the level of the second signal, generating a third control signal;
 (c) controlling the level of an output signal in response to the first through third control signals; and
 (d) outputting the output signal and generating the first signal and the second signal.

2. The method of claim 1, wherein the first control signal is used to increase the level of the output signal, the second control signal is used to reduce the level of the output signal, and the third control signal is used to hold the level of the output signal.

3. The method of claim 1, wherein the level of the first signal is higher than the level of the output signal by a predetermined offset, and the level of the second signal is lower than the level of the output signal by the offset.

4. The method of claim 1, wherein one of the first signal and the second signal has the same level as the level of the output signal, and the other has a level higher or lower than the level of the output signal by a predetermined offset.

5. The method of claim 1, wherein step (c) comprises:
 (c1) increasing a predetermined digital value in response to the first through third control signals and outputting the increased digital value;
 (c2) converting the output digital value into an output control signal which is an analog value; and (c3) controlling the level of the output signal in response to the output control signal.

6. A feedback control system comprising:
a detector, which compares the level of a reference signal with the levels of first and second signals, if the levels of the first and second signals are lower than the level of the reference signal, generates a first control signal, if the levels of the first and second signals are higher than the level of the reference signal, generates a second control signal, and if the level of the reference signal is between the level of the first signal and the level of the second signal, generates a third control signal;
a controller, which generates an output control signal used to control the level of an output signal in response to the first through third control signals; and
an output signal generator, which outputs the output signal in response to the output control signal and generates the first signal and the second signal.

7. The system of claim 6, wherein the controller includes:
a counter, which counts a digital value in response to the first through third control signals and outputs the digital value; and
a digital-to-analog converter, which converts the output of the counter into an output control signal which is an analog value.

8. The system of claim 6, wherein the first control signal is used to increase the level of the output signal, the second control signal is used to reduce the level of the output signal, and the third control signal is used to hold the level of the output signal.

9. The system of claim 6, wherein the level of the first signal is higher than the level of the output signal by a predetermined offset, and the level of the second signal is lower than the level of the output signal by the offset.

10. The system of claim 6, wherein one of the first signal and the second signal has the same level as the level of the output signal, and the other has a level higher or lower than the level of the output signal by a predetermined offset.

11. An output driver current control circuit comprising:
a detector, which compares the level of a reference current with the levels of first and second signals, if the levels of the first and second signals are lower than the level of the reference current, generates a first control signal, if the levels of the first and second signals are higher than the level of the reference current, generates a second control signal, and if the level of the reference current is between the level of the first signal and the level of the second signal, and generates a third control signal;
a counter, which outputs a first counter bit and a second counter bit used to control the current level of an output driver in response to the first through third control signals; and
an output driver controller, which controls the current level of the output driver in response to the first counter bit and the second counter bit and generates the first signal and the second signal.

12. The circuit of claim 11, wherein the detector includes:
a first comparison portion, which compares the level of the first signal with the level of the reference current;
a second comparison portion, which compares the level of the second signal with the level of the reference current; and
a determination portion, which generates the first through third control signals in response to the outputs of the first comparison portion and the second comparison portion.

13. The circuit of claim 11, wherein the output driver controller includes:
a first output driver, which controls the current level of the output driver in response to the first counter bit and outputs the first signal corresponding to the controlled current level; and
a second output driver, which controls the current level of the output driver in response to the second counter bit and outputs the second signal corresponding to the controlled current level.

14. The circuit of claim 11, wherein the first control signal is used to increase the level of the output signal, the second control signal is used to reduce the level of the output signal, and the third control signal is used to hold the level of the output signal.

15. The circuit of claim 11, wherein the output driver current control circuit is mounted on a Rambus DRAM.

16. A feedback control system comprising:
a detector, which compares the level of a reference signal with the levels of first and second signals, if the levels of the first and second signals are lower than the level of the reference signal, generates a first control signal, if the levels of the first and second signals are higher than the level of the reference signal, generates a second control signal, and if the level of the reference signal is between the level of the first signal and the level of the second signal, generates a third control signal;
a controller, which generates an output control signal used to control the level of an output signal in response to the first through third control signals, wherein the controller includes:
a counter, which counts a digital value in response to the first through third control signals and outputs the digital value; and
a digital-to-analog converter, which converts the output of the counter into an output control signal which is an analog value; and
an output signal generator, which outputs the output signal in response to the output control signal and generates the first signal and the second signal.

* * * * *